(12) United States Patent
Wadell

(10) Patent No.: US 7,639,030 B2
(45) Date of Patent: Dec. 29, 2009

(54) CREATING A JET IMPINGEMENT PATTERN FOR A THERMAL CONTROL SYSTEM

(75) Inventor: Robert Wadell, Sacremento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/974,613

(22) Filed: Oct. 15, 2007

(65) Prior Publication Data
US 2009/0095097 A1 Apr. 16, 2009

(51) Int. Cl.
G01R 31/02 (2006.01)
(52) U.S. Cl. .................................. 324/760
(58) Field of Classification Search ............ 324/760
See application file for complete search history.

(56) References Cited

U.S. PATENT DOCUMENTS 6,836,131 B2  12/2004 Cader et al. ............. 324/760
7,102,374 B2   9/2006 Cader et al. ............. 324/760
2006/0266497 A1* 11/2006 Berger et al. ........... 165/80.4
2007/0290702 A1* 12/2007 Lee ....................... 324/760

* cited by examiner

Primary Examiner—Ha Tran T Nguyen
Assistant Examiner—Shaun Campbell
(74) Attorney, Agent, or Firm—Trop, Pruner & Hu, P.C.

(57) ABSTRACT

In one embodiment, a head assembly to be adapted about a solid immersion lens includes a plurality of jets configured in a radial pattern that extends from a central portion to a substantial periphery of the head assembly. The jets may expel a liquid coolant stream to cool a semiconductor device with a radial impingement pattern so that the liquid coolant travels from a central portion of the semiconductor surface to a peripheral portion of the semiconductor surface. Other embodiments are described and claimed.

16 Claims, 3 Drawing Sheets

CREATING A JET IMPINGEMENT PATTERN FOR A THERMAL CONTROL SYSTEM

BACKGROUND

During the design and manufacture of semiconductor devices, oftentimes debug and validation processes occur in which a prototype semiconductor device is subjected to various electrical and other testing to ensure desired performance. One such testing mode that is used in advanced semiconductor devices includes optical testing implemented with a solid immersion lens (SIL), which receives optical energy emitted from the semiconductor device during injection of high speed electrical signals into the semiconductor device.

A solid immersion lens (SIL) requires direct contact with the silicon die to allow probing using a prober tool to debug and validate a semiconductor device. Providing an adequate thermal management solution to maintain maximum die temperatures between −10° Celsius (C) and 110° C. at core peak power densities of greater than 500 watts per square centimeter ($W/cm^2$) is a very challenging task for the following reasons. First, thermal heat spreading from circuitry such as processor cores is inhibited by removing an internal heat sink and thinning the die from 700 microns (um) to between 10 and 100 um. Second, the SIL lens form factor occupies 90% of the volume that could be used for heat removal via conduction, convection, or boiling. The SIL lens must move around the die, preventing any use of a heat sink attached on a backside of the die. Third, the thermal environment is expected to get worse as power densities are anticipated to exceed 560 $W/cm^2$ of total die power.

Cooling solutions to date have used a spray coolant flow pattern that begins at the outer edges of the die and converges to a stagnant pool of liquid across the middle of the die, called the stagnation zone. This stagnation zone surrounding the lens itself exhibits poor convective heat transfer coefficients and results in high die temperatures and large die thermal gradients near the lens.

DETAILED DESCRIPTION

In various embodiments, a thermal management system for integrated circuit (IC) testing can be realized to enable cooler die temperatures while performing high speed testing. In various embodiments, a cooling system may be provided for use in connection with SIL probing. The thermal management system may include a plurality of jets in an assembly adapted about the SIL to enable cooling of the die undergoing testing.

According to different embodiments, different jet patterns may be provided in such an assembly to enable transfer of a liquid coolant as jet streams that impact the die and travel across a portion of the die surface to enable greater cooling performance.

Figure 1A:
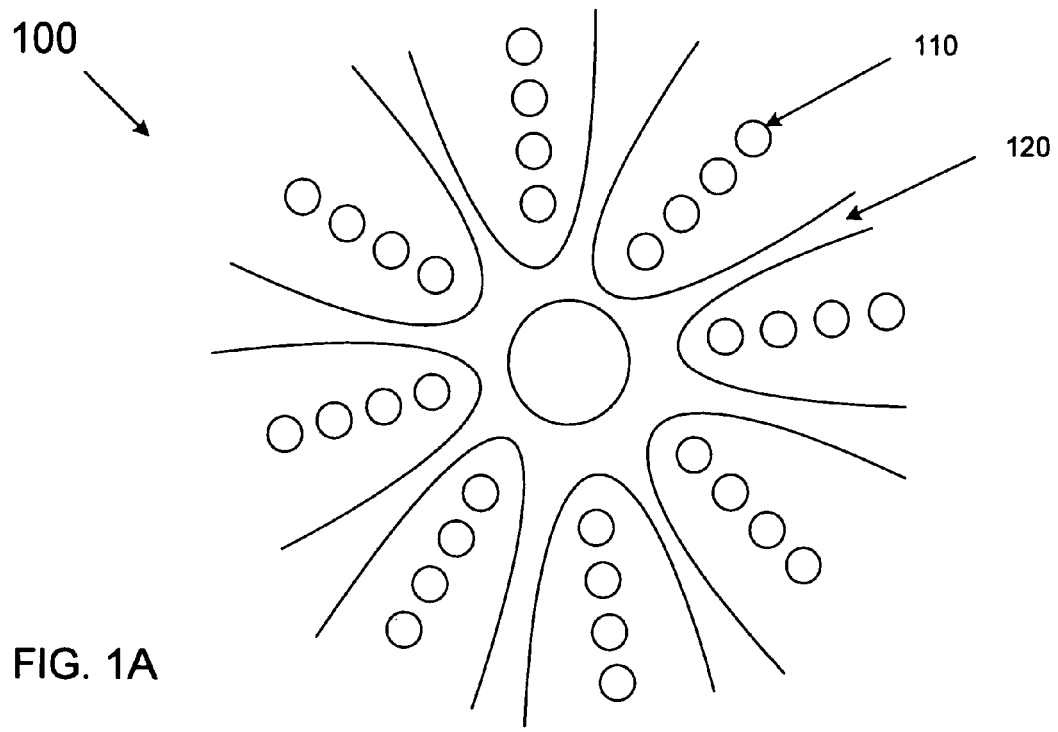
FIG. 1A is an illustration of a liquid flow pattern that is realized using a thermal system in accordance with one embodiment of the present invention.

Referring now to FIG. 1A, shown is an illustration of a liquid flow pattern that is realized using a thermal system in accordance with one embodiment of the present invention. As shown in FIG. 1A, a spider web pattern 100 is realized. Referring specifically to spider web pattern 100, a plurality of dots 110 represent impingement zones in which streams of fluid exiting from each of a plurality of jets in a housing impact a die. These jets may be linearly arranged in radial lanes extending outwardly from a center of the SIL. Also shown are a plurality of exit lanes 120 in which the liquid streams exit from the die surface. Thus in the embodiment of FIG. 1A, an inward-outward jet impingement cooling solution may be realized.

The inward-out jet impingement cooling solution uses water to cool the die during SIL probing at fluid temperatures between 0° C.-110° C. via single phase convection heat transfer. At temperatures below 0° C., inhibitors such as methanol, propylene glycol, or ethanol can be mixed with water to depress its freezing point. A liquid pump delivers the fluid to a reservoir and then to a header that either surrounds the lens in the form of a sleeve or that is incorporated directly into the SIL lens cap.

The flow on the surface of the die that results is a spider-web pattern, as shown in FIG. 1A. The fluid exits each of a plurality of jets in a lens cap or other housing, impacts the die, and exits towards the periphery of the die and lens. As will be described in FIG. 2 below, the fluid is collected in a collector below the SIL lens, drained, and is then cycled through a chiller to remove the heat picked up from the die. The fluid is then returned to a reservoir where it is stored for re-use.

Figure 1B:
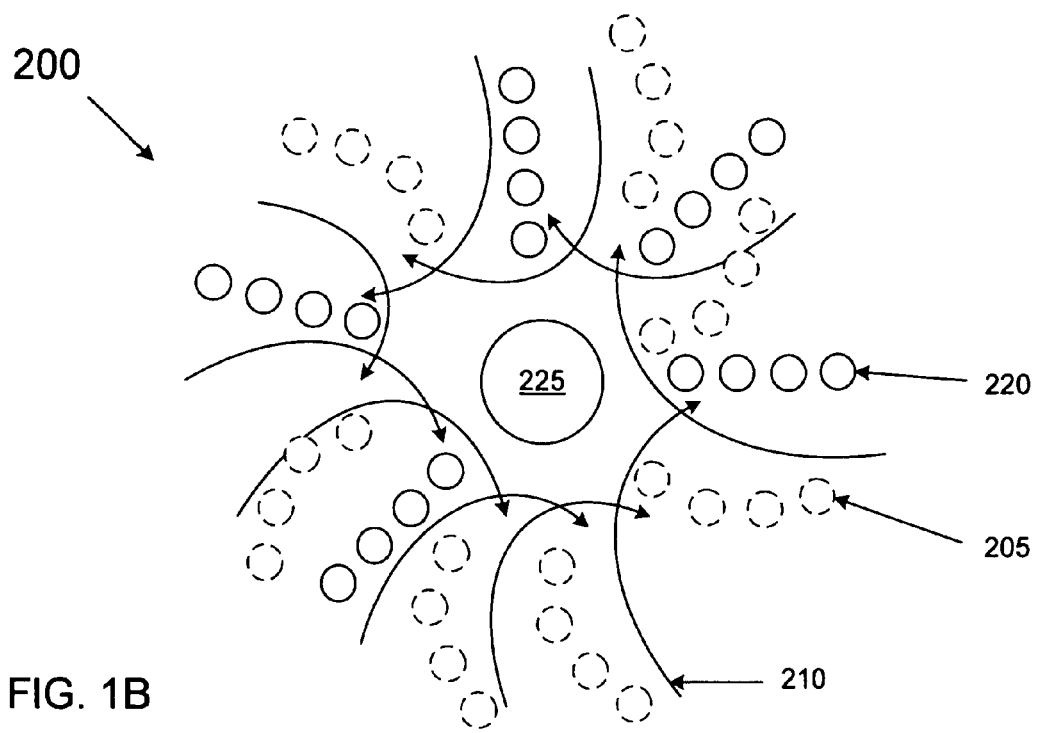
FIG. 1B is an illustration of a liquid flow pattern in accordance with another embodiment of the present invention.

While shown with this particular implementation in the embodiment of FIG. 1A, other cooling patterns can be realized. For example, referring now to FIG. 1B, shown is an illustration of a liquid flow pattern in accordance with another embodiment of the present invention. As shown in FIG. 1B, pattern 200 corresponds to a pattern that provides, potentially, an aligned and/or interstitial pattern to provide a liquid flow to maximize heat transfer. As shown in FIG. 1B, pattern 200 includes an interstitial jet pattern portion 210 in which liquid exiting a plurality of jets 205 (shown in dashed circles) that are arranged in a non-linear manner, e.g., spirally or in another manner, flow onto the die surface with a motion indicated by the lines of pattern portion 210. Furthermore, other jets 220 may be provided to enable an aligned jet pattern, e.g., by provision of these jets 220 in a linear manner. Based on a given pattern of jets provided in a housing or other cover for a SIL, the fluid may be delivered such that a radial jet pattern travels inwardly towards a center 225 of the lens, optionally with a velocity component on the die that is tangential such that a swirling effect, indicated by a so-called cyclone in a center portion of the die (i.e., corresponding to the tip of the SIL), thus moving the liquid away from the lens tip and outwardly towards the die edge, avoiding development of a stagnation zone.

For example, the specific inward radial jet impingement pattern 200 has an interstitial pattern 210 towards the center of the lens with a velocity component directed at the lens center 225, enabled by corresponding groups of spirally aligned jets 205, which may be adapted between corresponding linear tracks formed of a plurality of linear radial jets 220, which may cause an aligned jet pattern moving toward the periphery. The interstitial pattern 210 thus produces a swirling or cyclone effect of the fluid near the lens tip. The fluid exits each of the jets in the jet header, impacts the die, moves toward the lens cap in a swirling fashion, moves downward with gravity along the lens cap or other housing and horizontally along the channels to the drain.

Figure 1C:
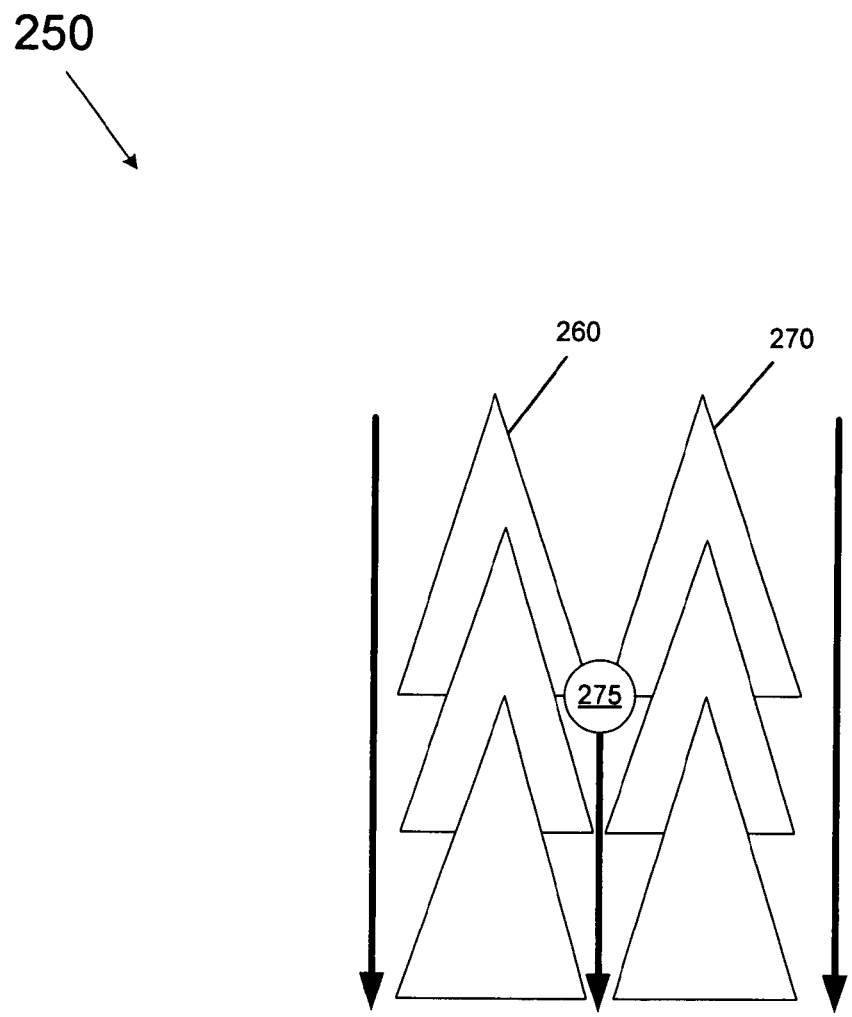
FIG. 1C is an illustration of a liquid flow pattern in accordance with yet another embodiment of the present invention.

Referring now to FIG. 1C, shown is an illustration of a liquid flow pattern in accordance with yet another embodiment of the present invention. As shown in FIG. 1C, in other implementations a uni-directional flow may be realized, e.g., using a set of uni-directionally arranged jets, which may be present in a rectangular pattern located at a periphery of one side of a substrate. As shown in FIG. 1C, flow pattern 250 may include a plurality of V-shaped patterns 260 and 270. Note that each of these patterns may include multiple V-shaped portions, each representing the travel of liquid coolant from a first side of a substrate to an opposite side of the substrate. Note that a lens center 275 may have adequate flow without stagnation, as the V-shaped patterns converge in line with lens center 275, minimizing the lack of fluid behind the lens center, such that the liquid sequentially flows across the entire surface of the substrate from the first side to the opposite side.

Figure 2:
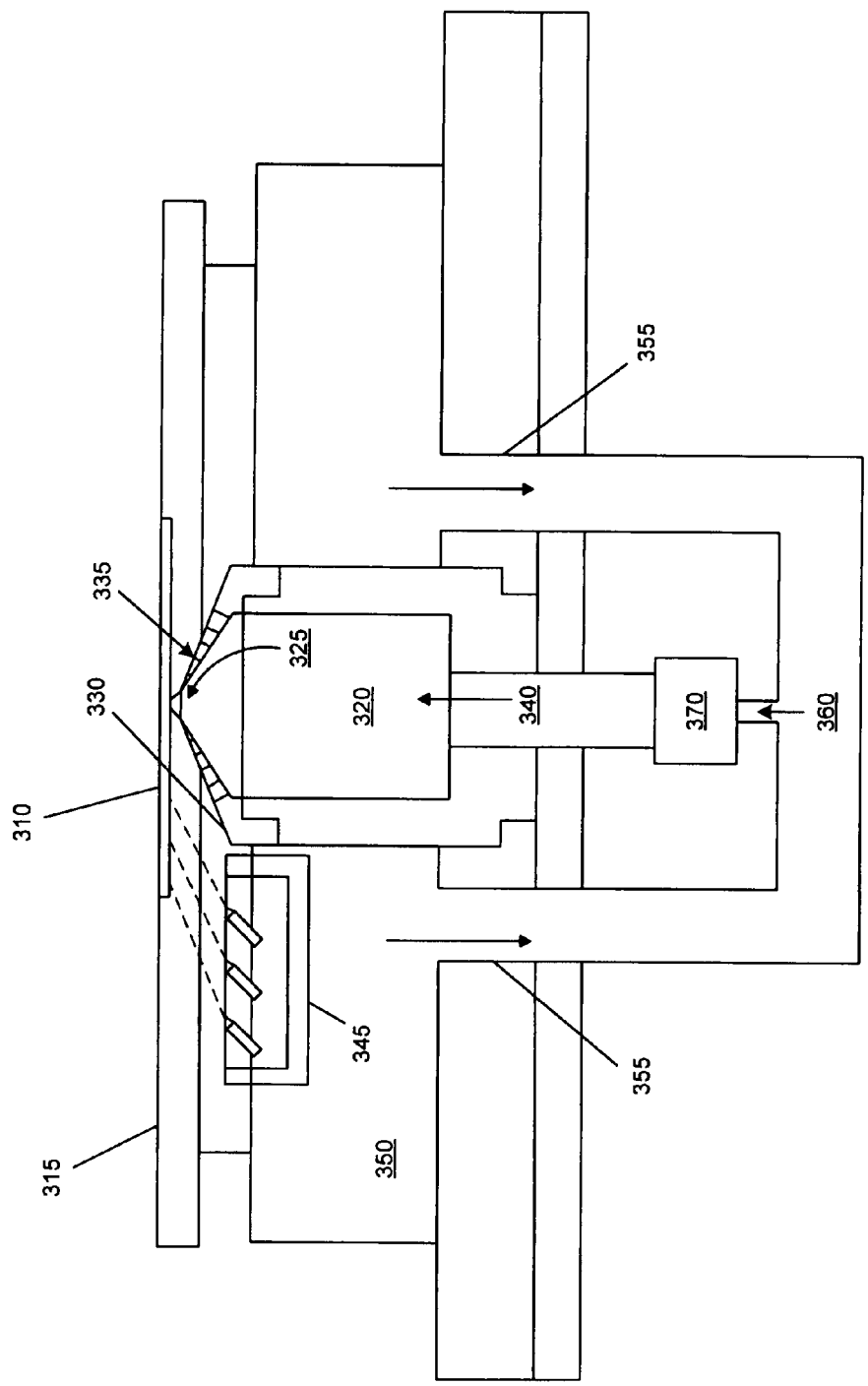
FIG. 2 is a cross-section view of a thermal system in accordance with one embodiment of the present invention.

Referring now to FIG. 2, shown is a cross-section view of a thermal system in accordance with one embodiment of the present invention. As shown in FIG. 2, thermal system 300 may generally be in the form of a chamber having a topside to support a die 310 undergoing testing (i.e., a device under test (DUT)). Die 310 is adapted to system 300 by a clamp 315, which may be adapted to the remainder of system 300 with appropriate sealing mechanisms such as O-rings or gaskets made out of open cell or closed cell foam, rubber or some other compliant sealing material. Shown within system 300 is a SIL 320 having a tip 325. Adapted about SIL 320 is a lens cap 330. As shown in FIG. 2 lens cap 330 may include a plurality of jets 335 to enable transfer of liquid coolant, i.e., as a single stream through each of the jets. As shown in FIG. 2, jets 335 may extend from a central portion near tip 325 to a substantially peripheral portion of lens cap 330. While described as a lens cap 330, more generally any head assembly to provide a plurality of jets to transfer liquid streams to the die surface may be used, such as an assembly that surrounds the periphery of the lens cap and delivers liquid inward toward the die and tip of the lens. As further shown in FIG. 2, an assembly 345, which may be a rectangular array of jets, may be used to provide a uni-directional flow pattern such that liquid coolant travels from a left to right side of die 310 (as shown in FIG. 2). In various embodiments, control of system 300 may be implemented to select jets 335 or array 345 for delivery of a jet flow to die 310.

While shown as being formed in a generally outwardly manner in the embodiment of FIG. 2, the scope of the present invention is not limited in this regard and in other implementations different arrangements of jets 335 may be realized. For example, for the embodiment shown in FIG. 2 such jets may be adapted within lens cap 330 at an angle of approximately 20° from a vertical axis (i.e., 20° to normal) with regard to die 310, although individual ones of jets 335 may vary. In other implementations, such as for realizing an inwardly directed jet pattern such as described above in regard to FIG. 1B, the jets may be more shallowly arranged, e.g., 20° from a horizontal axis (i.e., 70° approximately from a normal) of die 310.

Still referring to FIG. 2, incoming liquid coolant may be provided via an inward flow tube 340 such that it is fed up to lens cap 330 and outwardly through jets 335. Note that while flow tube 340 is shown being coupled to SIL 320 for ease of illustration, understand that in reality flow tube 340 may be adapted about a periphery of SIL 320 to provide liquid coolant for flow from jets 335 (and/or array 345). After traveling along the surface of die 310 (e.g., from the interior to the periphery of die 310), the liquid may drain into a collector 350 adapted about lens cap 330 and then through a plurality of flow drain pipes 355 to a chiller 360, where the heated liquid including heat pulled from die 310 may be cooled, whereupon a liquid is provided to a reservoir 370 where it may be stored until reapplied to die 310 through flow pipe 340 and jet header 330. While shown with this particular implementation in the embodiment of FIG. 2, the scope of the present invention is not limited in this regard.

The performance of an embodiment of the present invention has been demonstrated through examples and can be quantified by a convective heat transfer coefficient, which is defined as:

$$h_{conv} = \frac{q''}{Tj_{max} - T_{fluid}} \qquad [\text{EQ. 1}]$$

where $h_{conv}$ is the convective heat transfer coefficient, q" is the heat flux from the die surface, $Tj_{max}$ is a maximum junction temperature and $T_{fluid}$ is the fluid temperature. By using Equation 1, the minimum heat transfer coefficient in the flow pattern shown in FIG. 1A has been demonstrated through experimentation to be 4.7-9.4 W/cm²K, depending on the location on the die. Also the embodiment shown in FIG. 1B has shown performance of 2.8-9 W/cm²K, and the embodiment for the uni-directional flow in FIG. 1C has shown a heat transfer performance to be in the range of 4.5-9 W/cm²K. For comparison, conventional systems that produce a linear stagnation zone have a heat transfer coefficient range of 1.2-6.2 W/cm²K. These embodiments thus provide a minimum heat transfer coefficient, which drives maximum die temperature and ultimate performance, by approximately 2-4 times greater than current conventional cooling methods and enables probing of high performance semiconductor devices at a full temperature range of −10° C. to 110° C. by changing the coolant temperature between −40° C. and 110° C. Furthermore, using embodiments of the present invention and given a selected cooling pattern, die temperatures may be cooler near a SIL tip, allowing for superior thermal performance and control of die temperatures.

Embodiments thus enable peak power densities to be cooled with a full probing range of −10° C. to 110° C. In addition, the embodiments provide for a much better die temperature uniformity around the lens over a spray cooling solution.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a chamber having a top side to receive a semiconductor device under test (DUT);
   a solid immersion lens (SIL) adapted within the chamber to receive optical energy from the semiconductor DUT during a test operation; and
   a head assembly adapted about the SIL, the head assembly including a first plurality of jets configured in a radial pattern along a single linear radius of the head, the radial pattern extending from a central portion to a substantial periphery of the head assembly, each of the first plurality of jets to expel a non-spray liquid coolant single-phase stream to cool the semiconductor DUT, wherein the streams are to collectively and initially contact a surface of the semiconductor DUT with a radial impingement pattern along the single linear radius so that the streams collectively travel from a central portion of the semiconductor DUT surface to a peripheral portion of the semiconductor DUT surface.

2. The apparatus of claim 1, wherein the first plurality of jets are adapted outwardly from the central portion of the head assembly at an angle of less than approximately 20° with respect to a first axis normal to the semiconductor DUT surface.

3. The apparatus of claim 1, wherein the non-spray liquid coolant is to provide single phase conduction heat transfer from the semiconductor DUT to the non-spray liquid coolant.

4. The apparatus of claim 1, wherein the radial impingement pattern corresponds to a substantially spider web pattern.

5. The apparatus of claim 4, wherein the head assembly is a lens cap of the SIL.

6. The apparatus of claim 1, wherein the apparatus is to enable the semiconductor DUT to be probed at a peak power density across a probe range of between approximately −10° Celsius (C) and approximately 110° C.

7. The apparatus of claim 2, further comprising a second plurality of jets configured in a substantially spiral pattern non-parallel to the radius, at least some of the second plurality of jets configured between linear radial tracks that include the first plurality of jets and a third plurality of jets configured in a radial pattern along a another single linear radius.

8. The apparatus of claim 7, wherein the second plurality of jets is to cause a second impingement pattern to move the non-spray liquid coolant to the central portion of the semiconductor DUT and having a tangential velocity component to move the non-spray liquid coolant away from a tip of the SIL.

9. A system comprising:
a solid immersion lens (SIL) located within a chamber and adjacent to a semiconductor device under test (DUT) to receive optical energy from the semiconductor DUT during a test operation;
a head assembly adapted about the SIL, the head assembly including a first plurality of jets configured in a radial pattern, the radial pattern extending from a central portion to a substantial periphery of the head assembly, each of the first plurality of jets to expel a liquid coolant stream to cool the semiconductor DUT, wherein the streams are non-sprayed and in a single-phase liquid non-gaseous state and collectively adapted to contact a surface of the semiconductor DUT with a radial impingement pattern so that the liquid coolant travels from a central portion of the semiconductor DUT surface to a peripheral portion of the semiconductor DUT surface;
an array adapted to a periphery of the head assembly, wherein the away includes a second plurality of jets to expel the liquid coolant stream in a uni-directional pattern such that a uni-directional impingement pattern occurs so that the liquid coolant travels from a proximal side of the semiconductor DUT surface with respect to the array to a distal side of the semiconductor DUT surface with respect to the array;
a collector adapted below the head assembly, the collector to collect heated liquid coolant traveling off of the semiconductor DUT surface;
a chiller coupled to the collector to receive the heated liquid coolant and to cool the heated liquid coolant; and
a reservoir coupled to the chiller to store the liquid coolant and to provide the liquid coolant to the head assembly.

10. The system of claim 9, wherein the first plurality of jets are adapted outwardly from the central portion of the head assembly at an angle of less than approximately 30° with respect to a first axis normal to the semiconductor DUT surface.

11. The system of claim 9, wherein the radial impingement pattern corresponds to a substantially spider web pattern.

12. The system of claim 10, further comprising a third plurality of jets configured in a substantially spiral pattern, at least some of the third plurality of jets configured between linear tracks formed of the first plurality of jets.

13. The system of claim 12, wherein the third plurality of jets is to cause a second impingement pattern to move the liquid coolant to a central portion of the semiconductor DUT and having a tangential velocity component to move the liquid coolant away from a tip of the SIL.

14. The apparatus of claim 1, wherein the non-spray liquid coolant single-phase stream includes water and an inhibitor additive collectively chilled to less than zero degrees Celsius.

15. The apparatus of claim 8, further comprising an array adapted to a periphery of the head assembly, wherein the array includes a third plurality of jets to expel a non-spray liquid coolant single-phase stream in a uni-directional pattern such that a uni-directional impingement pattern occurs so that the liquid coolant travels from a proximal side of the semiconductor DUT surface with respect to the array to a distal side of the semiconductor DUT surface with respect to the array.

16. The apparatus of claim 1, wherein the head assembly includes a second plurality of jets configured in a radial pattern along another single linear radius, the radial pattern extending from the central portion to the substantial periphery of the head assembly, each of the second plurality of jets to expel a non-spray liquid coolant single-phase stream to cool the semiconductor DUT, wherein the streams from the first and second pluralities of jets are to exit the DUT surface along an exit lane formed between the radii.

* * * * *